(12) United States Patent
Park et al.

(10) Patent No.: US 8,535,637 B2
(45) Date of Patent: *Sep. 17, 2013

(54) THERMOELECTRIC CONVERSION MATERIAL AND ITS MANUFACTURING METHOD, AND THERMOELECTRIC CONVERSION DEVICE USING THE SAME

(75) Inventors: Cheol-Hee Park, Daejeon (KR); Se-Hui Sohn, Daejeon (KR); Won-Jong Kwon, Daejeon (KR); Seung-Tae Hong, Daejeon (KR); Tae-Hoon Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/463,511

(22) Filed: May 3, 2012

(65) Prior Publication Data

US 2012/0211045 A1 Aug. 23, 2012

Related U.S. Application Data

(63) Continuation of application No. 12/900,240, filed on Oct. 7, 2010, now Pat. No. 8,173,097, which is a continuation of application No. PCT/KR2009/004883, filed on Aug. 31, 2009.

(30) Foreign Application Priority Data

| Aug. 29, 2008 | (KR) | 10-2008-0085240 |
| Oct. 6, 2008 | (KR) | 10-2008-0097779 |
| Nov. 11, 2008 | (KR) | 10-2008-0111557 |

(51) Int. Cl.

| *H01L 35/00* | (2006.01) |
| *H01L 35/12* | (2006.01) |
| *H01L 35/16* | (2006.01) |
| *H01L 35/20* | (2006.01) |
| *C01B 19/04* | (2006.01) |
| *C01B 13/00* | (2006.01) |
| *C01B 13/14* | (2006.01) |
| *C01G 29/00* | (2006.01) |
| *C01G 3/02* | (2006.01) |
| *C01G 28/00* | (2006.01) |

(52) U.S. Cl.
USPC ........ 423/509; 136/200; 136/205; 136/236.1; 136/238; 136/240; 423/594.7; 423/593.1; 423/592.1; 423/604; 423/717

(58) Field of Classification Search
USPC ............. 136/238, 241, 200, 205, 236, 1, 240; 423/50, 594, 7, 593, 1, 592.1, 604, 617
See application file for complete search history.

(56) References Cited

U.S. PATENT DOCUMENTS

| 4,366,336 A | 12/1982 | Donaghey |
| 5,418,007 A | 5/1995 | Debe |

(Continued)

FOREIGN PATENT DOCUMENTS

| JP | 11-031849 | 2/1999 |
| JP | 11-186616 | 7/1999 |

(Continued)

OTHER PUBLICATIONS

Hiramatsu et al "Crystal Structures, Optoelectronic Properties, and Electronic Structures of Layered Oxychalcogenides MCuOCh (M=Bi, La; Ch=S, Se, Te): Effects of Electronic Configurations of M3+ Ions", Chemistry of Materials, vol. 20, Issue 1, pp. 326-334 (2008).*

(Continued)

*Primary Examiner* — Alexander Kollias
(74) *Attorney, Agent, or Firm* — McKenna, Long & Aldridge, LLP

(57) ABSTRACT

Disclosed is a new thermoelectric conversion material represented by the chemical formula 1: $Bi_{1-x}Cu_{1-y}O_{1-z}Te$, where $0 \leq x<1$, $0 \leq y<1$, $0 \leq z<1$ and $x+y+z>0$. A thermoelectric conversion device using said thermoelectric conversion material has good energy conversion efficiency.

9 Claims, 3 Drawing Sheets

(56) References Cited

U.S. PATENT DOCUMENTS

| | | | |
|---|---|---|---|
| 5,431,021 | A | 7/1995 | Gwilliam et al. |
| 5,487,952 | A | 1/1996 | Yoo et al. |
| 5,726,381 | A | 3/1998 | Horio et al. |
| 6,091,014 | A | 7/2000 | Eklund et al. |
| 6,251,701 | B1 | 6/2001 | McCandless |
| 6,444,894 | B1 | 9/2002 | Sterzel |
| 6,660,925 | B1 | 12/2003 | Sharp |
| 6,743,973 | B2 | 6/2004 | Hayashi et al. |
| 6,942,728 | B2 | 9/2005 | Caillat et al. |
| 7,091,136 | B2 | 8/2006 | Basol |
| 7,649,139 | B2 | 1/2010 | Mihara et al. |
| 8,173,097 | B2 * | 5/2012 | Park et al. ............. 423/509 |
| 2003/0110892 | A1 | 6/2003 | Nicoloau |
| 2005/0139249 | A1 | 6/2005 | Ueki et al. |
| 2011/0017935 | A1 * | 1/2011 | Park et al. ............. 252/62.3 T |

FOREIGN PATENT DOCUMENTS

| | | |
|---|---|---|
| JP | 2001-223392 | 8/2001 |
| JP | 2002-232026 | 8/2002 |
| JP | 2004-288841 | 10/2004 |
| JP | 2007-258200 | 10/2007 |
| JP | 2008-085309 | 4/2008 |

OTHER PUBLICATIONS

Hiramatsu et al Supporting Information for Crystal Structures, Optoelectronic Properties, and Electronic Structures of Layered Oxychalcogenides MCuOCh (M=Bi, La; Ch=S, Se, Te): Effects of Electronic Configurations of M3+ Ions, Chemistry of Materials, vol. 20, Issue 1, pp. 1-3, (2008).*

Kouichi Takase et al., "Charge Density Distribution of Transparent p-type Semiconductor (LaO) CuS", Applied Physics Letters 90, (2007) pp. 161916 (1-3).

B.A. Popovkin et al., "New Layered Phases of the MOCuX (M=Ln, Bi; X=S, Se, Te) Family: A Geometric Approach to the Explanation of Phase Stability", Russian Journal of Inorganic Chemistry, vol. 43, No. 10, 1998, pp. 1471-1475.

Evans et al "Synthesis and characterization of the new oxyselenide Bl2YO4Cu2Se2", Chem. Commun., 2002, 912-913.

Stampler et al. "Temperature Driven Reactant Solubilization Synthesis of BiCuOSe", Inorg. Chem. 2008, 47, 10009-16.

Zhao et al "Bi1-xSrxCuSeO oxyselenides as promising thermoelectric materials", Applied Physics Letters 97, 092118 (2010).

Sheets et al. "Facile Synthesis of BiCuOS by Hydrothermal Synthesis", Inorganic Chem. 2007, 46, 10741-48.

Ohtani et al "Electrical properties of layered copper oxyselenides (BiO)Cu1-xSe and (Bi1-xSrx)OcuSe", Journal of Alloys and compounds 262-263 (1997) 175-79.

* cited by examiner

THERMOELECTRIC CONVERSION MATERIAL AND ITS MANUFACTURING METHOD, AND THERMOELECTRIC CONVERSION DEVICE USING THE SAME

CROSS-REFERENCE TO RELATED APPLICATION

This application is a continuation of U.S. patent application Ser. No. 11/900,240, filed on Oct. 7, 2010, now U.S. Pat. No. 8,173,097 which is a continuation of International Application No. PCT/KR2009/004883 filed on Aug. 31, 2009, which claims priority to Korean Patent Application Nos. 10-2008-0085240, 10-2008-0097779 and 10-2008-0111557 filed in the Republic of Korea on Aug. 29, 2008, Oct. 6, 2008 and Nov. 11, 2008, respectively, the entire contents of which are incorporated herein by reference.

BACKGROUND OF THE INVENTION

1. Field of the Invention

The present invention relates to a thermoelectric conversion material and its manufacturing method, and a thermoelectric conversion device using the same.

2. Description of the Related Art

A thermoelectric conversion device is used to thermoelectric power generation, thermoelectric cooling and so on. For example, thermoelectric power generation is a type of power generation that converts thermal energy into electric energy using a thermoelectromotive force caused by temperature difference in a thermoelectric conversion device.

The energy conversion efficiency of the thermoelectric conversion device is determined depending on Seebeck coefficient, electrical conductivity and thermal conductivity of a thermoelectric conversion material. More specifically, the energy conversion efficiency of the thermoelectric conversion material is in proportion to the square of Seebeck coefficient and the electrical conductivity, and in inverse proportion to the thermal conductivity. Therefore, it is required that the development of a thermoelectric conversion material having high Seebeck coefficient or high electrical conductivity or low thermal conductivity so as to improve the energy conversion efficiency of a thermoelectric conversion device.

SUMMARY OF THE INVENTION

It is an object of the present invention to provide a thermoelectric conversion material having good thermoelectric conversion performance.

And, it is an object of the present invention to provide a method for manufacturing said thermoelectric conversion material.

Furthermore, it is an object of the present invention to provide a thermoelectric conversion device using said thermoelectric conversion material.

After repeated study of thermoelectric conversion materials, the inventors succeeded a synthesis of a compound semiconductor represented as the following chemical formula 1. And, the inventors discovered that this compound can be used as a thermoelectric conversion material of a thermoelectric conversion device, and accomplished this invention.

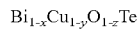   <Chemical formula 1> where $0 \leq x < 1$, $0 \leq y < 1$, $0 \leq z < 1$ and $x+y+z>0$.

In the chemical formula 1, x, y and z are preferably $0 \leq x \leq 0.5$, $0 \leq y \leq 0.5$ and $0 \leq z \leq 0.5$, respectively, more preferably $0 \leq x \leq 0.2$, $0 \leq y \leq 0.2$ and $0 \leq z \leq 0.2$, respectively.

The present invention also provides a method for manufacturing said thermoelectric conversion material represented by the above chemical formula 1 by mixing each powder of $Bi_2O_3$, Bi, Cu and Te and sintering the mixed material.

In the manufacturing method of the present invention, the sintering temperature is preferably 400 to 570° C.

EFFECTS OF THE PRESENT INVENTION

The thermoelectric conversion material according to the present invention has good thermoelectric conversion performance, and thus it can be usefully applied to a thermoelectric conversion device instead of or together with a conventional thermoelectric conversion material.

BRIEF DESCRIPTION OF THE DRAWINGS

The accompanying drawings illustrate the preferred embodiments of the present invention and are included to provide a further understanding of the spirit of the present invention together with the detailed description of the invention, and accordingly, the present invention should not be limitedly interpreted to the matters shown in the drawings

DESCRIPTION OF THE PREFERRED EMBODIMENT

Figure 1:
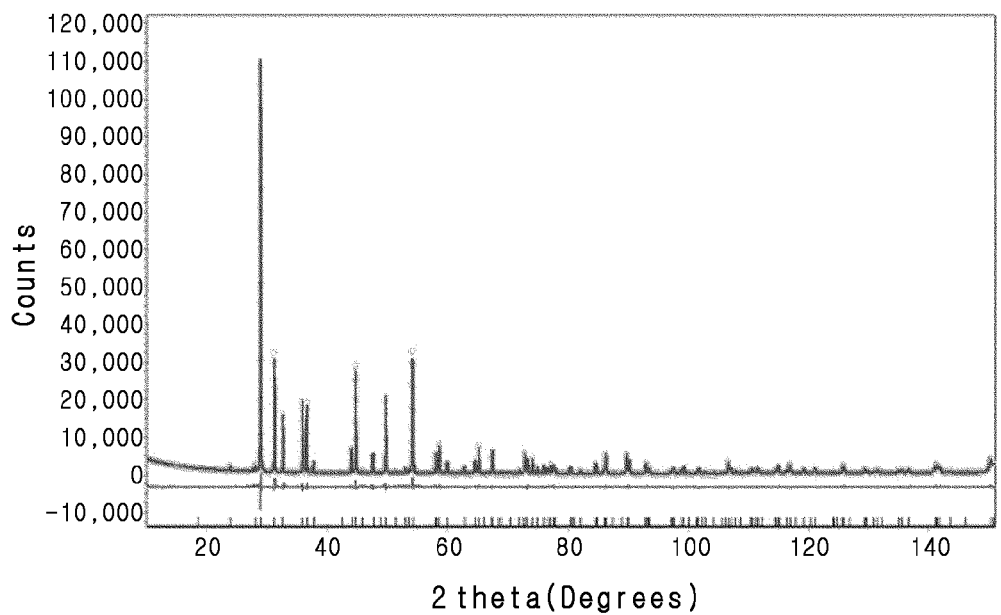
FIG. 1 is a graph illustrating a Rietveld profile of BiCuOTe by comparison between an X-ray diffraction pattern and a theoretical pattern of a structural model.

A thermoelectric conversion material according to the present invention is represented by the following chemical formula 1.

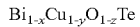   <Chemical formula 1> where $0 \leq x < 1$, $0 \leq y < 1$, $0 \leq z < 1$ and $x+y+z>0$.

In the chemical formula 1, x, y and z are preferably $0 \leq x \leq 0.5$, $0 \leq y \leq 0.5$ and $0 \leq z \leq 0.5$, respectively, more preferably $0 \leq x \leq 0.2$, $0 \leq y \leq 0.2$ and $0 \leq z \leq 0.2$, respectively.

In other words, the thermoelectric conversion material according to the present invention is characterized by a relative deficiency of at least one of Bi, Cu and O in BiCuOTe. Specifically, in the case of deficiency of only Bi, x, y and z in the above chemical formula 1 may be $0<x \leq 0.1$, $y=0$ and $z=0$, respectively. In the case of deficiency of only Cu, x, y and z may be $x=0$, $0<y \leq 0.2$ and $z=0$, respectively. In the case of deficiency of both Bi and O, x, y and z may be $0<x \leq 0.1$, $y=0$ and $0<z \leq 0.1$, respectively.

As mentioned above, the higher the Seebeck coefficient and electrical conductivity and the lower the thermal conductivity, the higher the thermoelectric conversion performance. Though description will be given below, BiCuOTe has a superlattice structure in which a $Cu_2Te_2$ layer and a $Bi_2O_2$ layer are repeated along a c-crystal axis, and thus it has a remarkably lower thermal conductivity than $Bi_2Te_3$, a typical commercial thermoelectric conversion material, and has a Seebeck coefficient similar to or higher than $Bi_2Te_3$. Thus, BiCuOTe is very useful as a thermoelectric conversion material. However, BiCuOTe has a relatively low electrical conductivity. To improve the electrical conductivity, it needs to increase the concentration of carriers, i.e. holes. In the present invention, an increase in carrier concentration is achieved by a relative deficiency of at least one element of Bi, Cu and O.

Accordingly, the thermoelectric conversion material according to the present invention is a new material that is different from a conventional thermoelectric conversion material. The thermoelectric conversion material according to the present invention has excellent thermoelectric conversion performance, and thus it can be usefully applied to a thermoelectric conversion device instead of or together with a conventional thermoelectric conversion material.

The thermoelectric conversion material of the above chemical formula 1 may be manufactured by mixing each powder of $Bi_2O_3$, Bi, Cu and Te and sintering the mixed material, however the present invention is not limited in this regard.

The compound semiconductor according to the present invention may be manufactured by sintering in vacuum or sintering while flowing gas such as Ar, He, $N_2$, etc. that partially contains hydrogen or does not contains hydrogen. The sintering temperature is preferably around 400 to 750° C., more preferably 400 to 570° C.

Meanwhile, although the above description is made on the basis that Te in the thermoelectric conversion material according to the present invention is used at a stoichiometrically fixed amount, Te may be partially substituted by another element such as S, Se, As, Sb and so on. This case follows the concept of the present invention that a partial deficiency of at least one element of Bi, Cu and O leads to an increase in carrier concentration, resulting in improvement of thermoelectric conversion performance. Therefore, it should be interpreted that the scope of the present invention covers the case in which an element other than an element having a partial deficiency is substituted by another element.

Hereinafter, the present invention will be described in detail with reference to the following examples. However, various modifications and changes may be made to the examples of the present invention, and it should not be interpreted that the scope of the present invention is limited to the following examples. The examples of the present invention are provided to an ordinary person skilled in the art for more complete understanding of the present invention.

REFERENCE EXAMPLE

Synthesis of BiCuOTe

First, for synthesis of BiCuOTe, 1.1198 g of $Bi_2O_3$ (Aldrich, 99.9%, 100 mesh), 0.5022 g of Bi (Aldrich, 99.99%, <10 m), 0.4581 g of Cu (Aldrich, 99.7%, 3 m) and 0.9199 g of Te (Aldrich, 99.99%, ~100 mesh) were mixed well using an agate mortar. The mixed material was put into a silica tube, vacuum-sealed and heated at 510° C. for 15 hours, so that BiCuOTe powder was obtained.

For an X-ray diffraction analysis, a test section was pulverized well, placed in a sample holder of an X-ray diffraction analyzer (Bruker D8-Advance XRD), and measured by scanning, wherein a scan interval was 0.02 degrees, Cu $K\alpha_1$ ($\lambda=1.5405$ Å) X-ray radiation was used, the applied voltage was 50 KV and the applied current was 40 mA.

A crystal structure of the obtained material was analyzed using TOPAS program (R. W. Cheary, A. Coelho, J. Appl. Crystallogr. 25 (1992) 109-121; Bruker AXS, TOPAS 3, Karlsruhe, Germany (2000)), and the analysis results are shown in the following Table 1 and FIG. 2.

TABLE 1

<The crystallographic data obtained from Rietveld refinement of BiCuOTe> [Space group I4/nmm (No. 129), a = 4.04138(6) Å, c = 9.5257(2) Å]

| Atom | Site | x | y | z | Occup. | Beq |
|---|---|---|---|---|---|---|
| Bi | 2c | 0.25 | 0.25 | 0.37257(5) | 1 | 0.56(1) |
| Cu | 2a | 0.75 | 0.25 | 0 | 1 | 0.98(3) |
| O | 2b | 0.75 | 0.25 | 0.5 | 1 | 0.26(12) |
| Te | 2c | 0.25 | 0.25 | 0.81945(7) | 1 | 0.35(1) |

FIG. 1 is a graph illustrating a Rietveld profile of BiCuOTe by comparison between an X-ray diffraction pattern and a theoretical pattern of a structural model. Referring to FIG. 1, it was found that the measured pattern was consistent with the calculated pattern according to the results of Table 1. Thus, the material obtained according to the reference example was identified as BiCuOTe.

Figure 2:
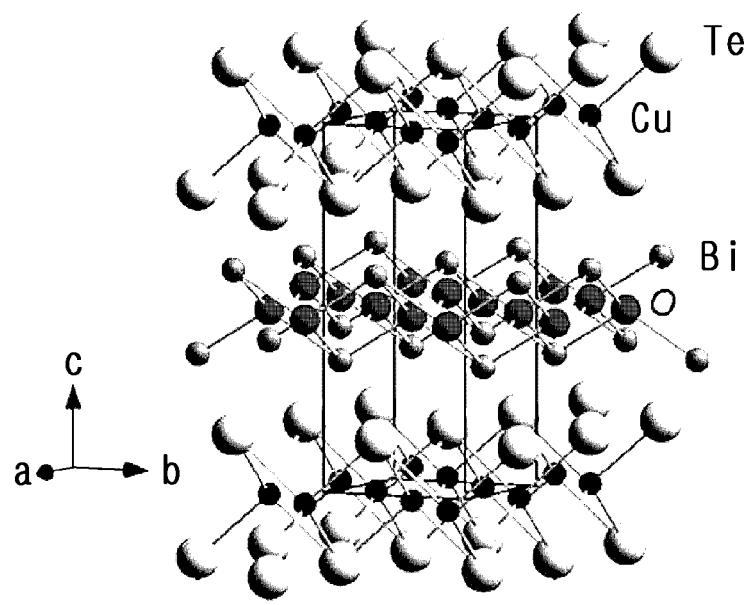
FIG. 2 is a view illustrating a crystal structure of BiCuOTe.

As shown in FIG. 2, this BiCuOTe compound semiconductor exhibits a natural superlattice structure that a $Cu_2Te_2$ layer and a $Bi_2O_2$ layer are repeated along a c-crystal axis.

Examples 1 and 2

Synthesis of $Bi_{1-x}CuOTe$ $Bi_{1-x}CuOTe$ was synthesized in the same way the reference example except that a mixing amount of each raw powder was controlled according to the following table 2 for a partial deficiency of Bi in BiCuOTe. The mixing amount of each raw powder for synthesis is as follows (unit: g).

TABLE 2

| Classification | $Bi_2O_3$ | Bi | Cu | Te |
|---|---|---|---|---|
| Example 1 (x = 0.01) | 1.6881 | 0.7344 | 0.6907 | 1.3868 |
| Example 2 (x = 0.04) | 1.7141 | 0.6765 | 0.7013 | 1.4082 |

Examples 3 to 5

Synthesis of $BiCu_{1-y}OTe$ $BiCu_{1-y}OTe$ was synthesized in the same way the reference example except that a mixing amount of each raw powder was controlled according to the following table 3 for a partial deficiency of Cu in BiCuOTe. The mixing amount of each raw powder for synthesis is as follows (unit: g).

TABLE 3

| Classification | $Bi_2O_3$ | Bi | Cu | Te |
|---|---|---|---|---|
| Example 3 (y = 0.01) | 1.6822 | 0.7545 | 0.6814 | 1.3820 |
| Example 4 (y = 0.04) | 1.6900 | 0.7579 | 0.6638 | 1.3884 |
| Example 5 (y = 0.1) | 1.7057 | 0.7650 | 0.6281 | 1.4013 |

Example 6

Synthesis of $Bi_{0.96}CuO_{0.94}Te$ $Bi_{0.96}CuO_{0.94}Te$ was synthesized in the same way the reference example except that a mixing amount of $Bi_2O_3$ was relatively reduced for a partial deficiency of both Bi and O. A mixing amount of each raw powder for synthesis is as follows (unit: g).

TABLE 4

| Classification | $Bi_2O_3$ | Bi | Cu | Te |
|---|---|---|---|---|
| Example 6 | 1.6150 | 0.7706 | 0.7029 | 1.4115 |

Figure 3:
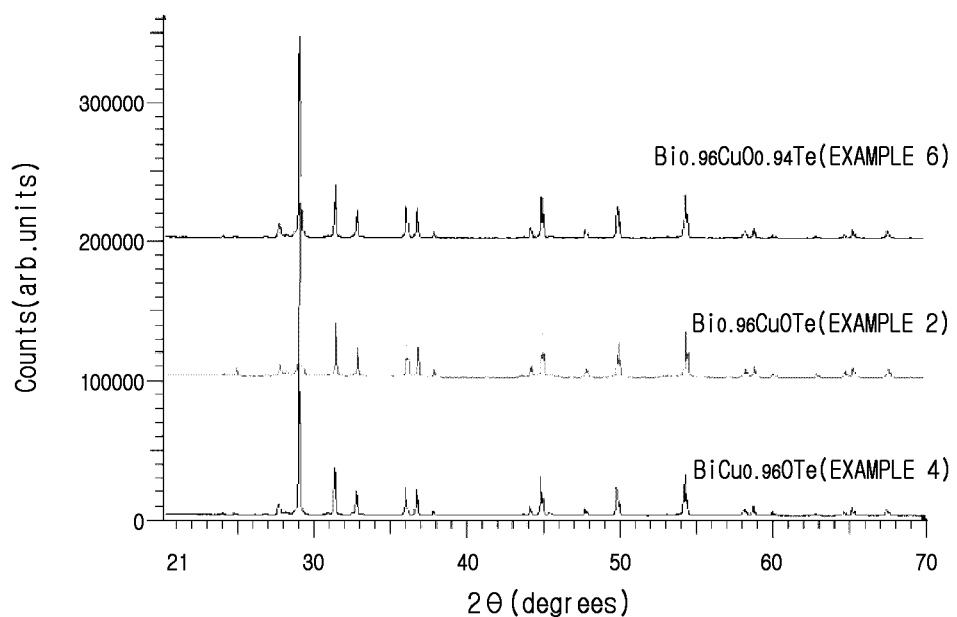
FIG. 3 is a graph illustrating X-ray diffraction patterns of compounds according to examples 2, 4 and 6 of the present invention.

And, test sections of the compounds according to the examples 2, 4 and 6 were prepared in the same way as the reference example and gone through an X-ray diffraction analysis, and each material was identified as shown in FIG. 3.

<Evaluation of Thermoelectric Conversion Performance>

Each of the test sections obtained according to the reference example and the examples as mentioned above was molded into a cylinder having a diameter of 4 mm and a length of 15 mm. Pressure of 200 Mpa was applied to the cylinder using a CIP (Cold Isostatic Press). Subsequently, the resulting product was put into a quartz tube and vacuum-sintered at 510° C. for 10 hours.

Each of the sintered test sections was measured using ZEM-2 (Ulvac-Rico, Inc) at a predetermined temperature interval for electrical conductivity and Seebeck coefficient. A power factor was calculated that serves as an indicator of thermoelectric conversion performance and is defined as multiplication of the square of Seebeck coefficient by electrical conductivity. The calculated power factor is shown in FIGS. 4 to 6.

Figure 4:
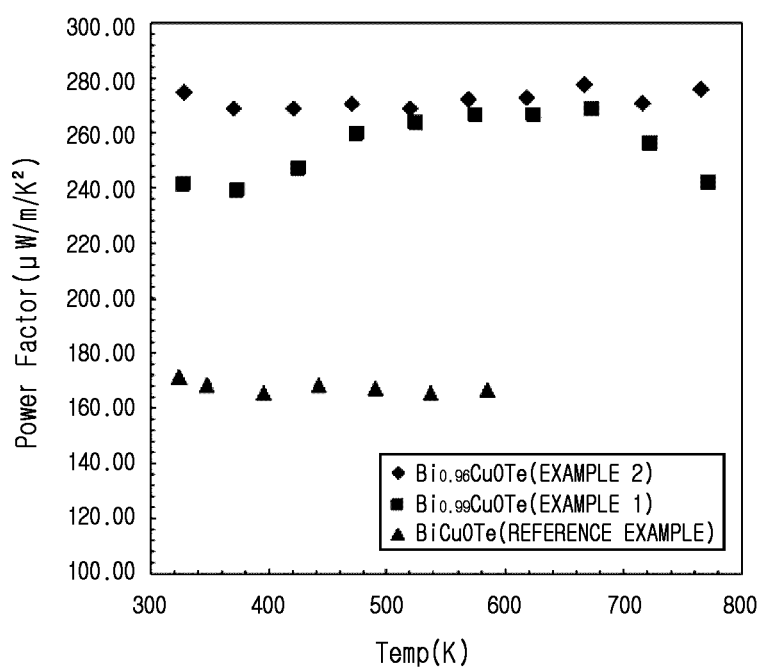
FIG. 4 is a graph illustrating power factors of compounds according to examples 1 and 2 of the present invention and a compound according to a reference example.
Figure 5:
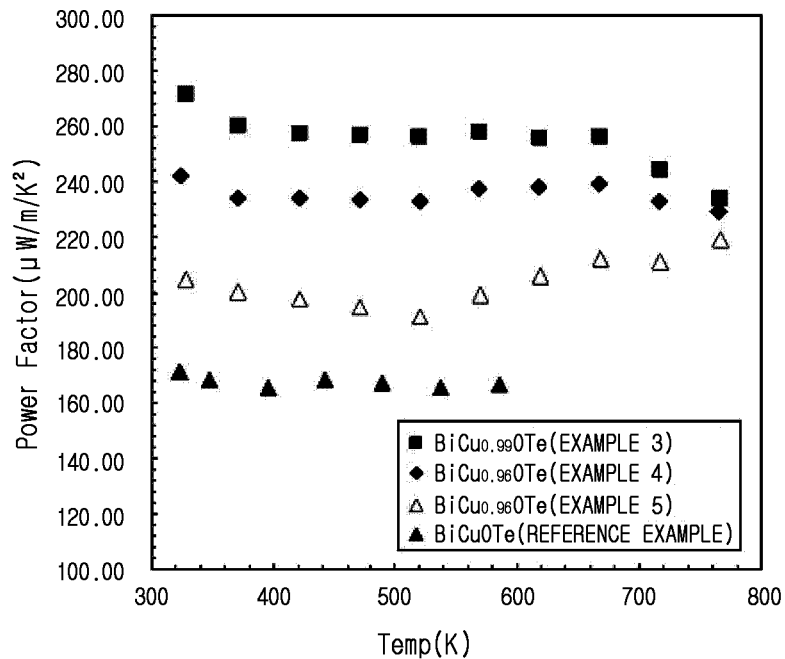
FIG. 5 is a graph illustrating power factors of compounds according to examples 3 to 5 of the present invention and a compound according to a reference example.
Figure 6:
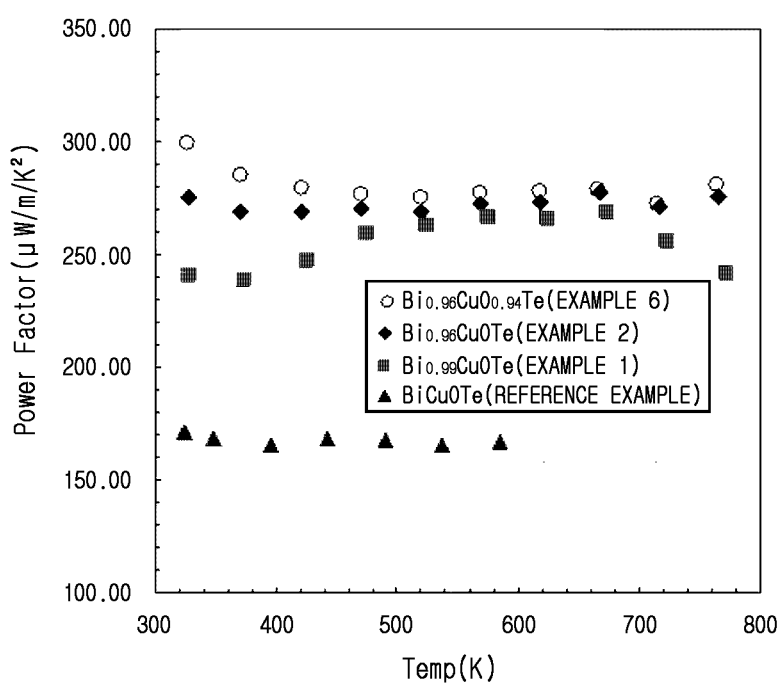
FIG. 6 is a graph illustrating power factors of compounds according to examples 1, 2 and 6 of the present invention and a compound according to a reference example.

Referring to FIGS. 4 to 6, it is found that the thermoelectric conversion materials according to the examples 1 to 6 have a remarkable improvement in power factor, compared to BiCuOTe of the reference example, and thus the thermoelectric conversion material according to the present invention has good thermoelectric conversion performance.

What is claimed is:

1. Thermoelectric conversion materials BiCuOTe having a natural super-lattice structure in which $Cu_2Te_2$ layers alternate with $Bi_2O_2$ layers along a c-crystalline axis,
    wherein at least one element selected from the group consisting of Bi, Cu and O is partially deficient, and
    wherein, when each of x, y and z is a ratio of the deficiency in Bi, Cu and O, respectively, the x, y and z satisfy the following relations:
    $0 \leq x \leq 1$, $0 \leq y \leq 1$, $0 \leq z \leq 1$ and $x+y+z>0$.

2. The thermoelectric conversion materials according to claim 1,
    wherein, when each of x, y and z is a ratio of the deficiency in Bi, Cu and O, respectively, the x, y and z satisfy the following relations:
    $0 \leq x \leq 0.5$, $0 \leq y \leq 0.5$ and $0 \leq z \leq 0.5$.

3. The thermoelectric conversion materials according to claim 2, wherein the x, y and z satisfy the following relations:
    $0 \leq x \leq 0.2$, $0 \leq y \leq 0.2$ and $0 \leq z \leq 0.2$.

4. The thermoelectric conversion materials according to claim 3,
    wherein the x, y and z satisfy the following relations:
    $0 < x \leq 0.1$, $y=0$ and $z=0$.

5. The thermoelectric conversion materials according to claim 3,
    wherein the x, y and z satisfy the following relations:
    $x=0$, $0 < y \leq 0.2$ and $z=0$.

6. The thermoelectric conversion materials according to claim 3,
    wherein the x, y and z satisfy the following relations:
    $0 < x \leq 0.1$, $y=0$ and $0 < z \leq 0.1$.

7. A method for manufacturing thermoelectric conversion materials defined in claim 1, comprising:
    mixing each powder of $Bi_2O_3$, Bi, Cu and Te; and
    sintering the mixed materials to manufacture the thermoelectric conversion materials.

8. The method for manufacturing thermoelectric conversion materials according to claim 7,
    wherein the sintering temperature is 400 to 570° C.

9. A thermoelectric conversion device including the thermoelectric conversion materials defined in claim 1.

* * * * *